(12) United States Patent
Suzumura et al.

(10) Patent No.: US 6,791,034 B2
(45) Date of Patent: Sep. 14, 2004

(54) CIRCUIT BOARD AND PRODUCTION METHOD THEREFOR

(75) Inventors: Masaki Suzumura, Mie (JP); Kazuo Okada, Mie (JP); Koichi Hirano, Osaka (JP); Takaaki Okawa, Mie (JP); Shinya Tanaka, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/238,688

(22) Filed: Sep. 10, 2002

(65) Prior Publication Data

US 2003/0072136 A1 Apr. 17, 2003

Related U.S. Application Data

(63) Continuation-in-part of application No. PCT/JP02/00074, filed on Jan. 10, 2002.

(30) Foreign Application Priority Data

Jan. 11, 2001 (JP) ........................................ 2001-003312
Jan. 11, 2001 (JP) ........................................ 2001-003313

(51) Int. Cl.⁷ ................................................. H05K 1/00
(52) U.S. Cl. ...................... 174/252; 174/254; 361/688; 361/813; 257/675
(58) Field of Search ................................. 174/252, 254, 174/256, 260; 361/760, 749, 750, 688, 702, 713, 813, 772, 776; 257/675, 676, 692, E23.051, E23.043, E23.54

(56) References Cited

U.S. PATENT DOCUMENTS

| | | | | |
|---|---|---|---|---|
| 5,814,877 A | * | 9/1998 | Diffenderfer et al. | 257/666 |
| 5,814,878 A | * | 9/1998 | Hirakawa et al. | 257/667 |
| 5,998,856 A | * | 12/1999 | Noda et al. | 256/666 |
| 6,060,150 A | | 5/2000 | Nakatani et al. | |
| 6,194,777 B1 | * | 2/2001 | Abbott et al. | 257/666 |
| 6,225,701 B1 | * | 5/2001 | Hori et al. | 257/783 |
| 6,391,684 B2 | * | 5/2002 | Ohsawa | 438/111 |
| 6,518,647 B1 | * | 2/2003 | Tellkamp | 257/646 |
| 6,559,536 B1 | * | 5/2003 | Katoh et al. | 257/712 |

FOREIGN PATENT DOCUMENTS

| | | |
|---|---|---|
| JP | 4-340258 | 11/1992 |
| JP | 8-139254 | 5/1996 |
| JP | 11-150143 | 6/1999 |

OTHER PUBLICATIONS

PCT International Search Report, Mar. 26, 2002.

* cited by examiner

Primary Examiner—Kamand Cuneo
Assistant Examiner—J B Patel
(74) Attorney, Agent, or Firm—RatnerPrestia

(57) ABSTRACT

A lead frame of a circuit board is punched in a direction opposite to a heat sink plate. Even if burrs are produced due to the punching, the burrs do not penetrate a sheet or short-circuit to the heat sink plate. A resist film tightly contacts on the periphery of a land of the lead frame of the circuit board, and a plated layer tightly contacts on the land. This prevents electronic components from defective mounting on the land.

4 Claims, 4 Drawing Sheets

CIRCUIT BOARD AND PRODUCTION METHOD THEREFOR

This application is a continuation-in-part of application PCT/JP02/00074 filed on Jan. 10, 2002.

TECHNICAL FIELD

The present invention relates to a circuit board improved in heat dissipation and to a method of manufacturing the board.

BACKGROUND ART

According to a recent trend of electronic equipment having a higher performance and a smaller size, semiconductors are strongly demanded to have higher density and performance. A circuit board for mounting such semiconductors is accordingly desired to have a smaller size and a higher density. This arises a problem of heat dissipation of, for example, power semiconductors mounted at a high density.

A prior art for improving the heat dissipation is implemented by a lead frame including a conductor, such as a heat sink plate, integrated via a sheet. The lead frame has a circuit pattern formed by punching out unnecessary portions for a circuit from a plate. Upon being punched in a direction to the heat sink plate, the plate has burrs generated due to the punching. The burrs approach the heat sink plate through the sheet, and may cause short-circuiting to the heat sunk plate.

Another conventional lead frame has a circuit pattern including a land for mounting an electronic component. In order to form a land, a plated layer is formed on the entire surface of the circuit pattern, and a resist film is then disposed on the plated layer. The resist film is not formed on a portion of the land, where the plated layer exposes, and the portion serve as a land.

The plated layer on the portion melts due to heat from solder during the mounting of the electronic component, and may move between the lead frame surface and the resist film.

As the plated layer moves, a plated layer on the land become thinner, and this causes defective mounting of the electronic component.

DISCLOSURE OF THE INVENTION

A circuit board includes a sheet, a lead frame which has a circuit pattern and is bonded to the sheet, and a heat sink plate bonded to a surface of the sheet opposite to the lead frame. The circuit pattern of the lead frame is formed by punching a plate from a surface of the plate bonded to the sheet. The circuit board prevents the lead frame from short-circuiting to a conductor, such as the heat sink plate.

DETAILED DESCRIPTION OF PREFERRED EMBODIMENTS

Figure 1:
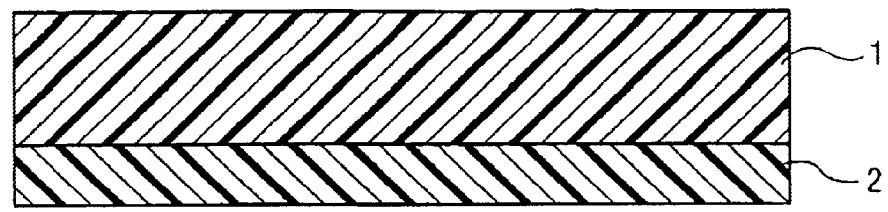
FIG. 1 is a sectional view of a sheet according to an exemplary embodiment of the present invention.

FIG. 1 is a sectional view of a sheet according to an exemplary embodiment of the present invention. A mixture slurry containing an inorganic filler, thermosetting resin composite, and solvent is prepared, and sheet 1 is formed by coating the slurry on releasing film 2. A method of the coating may employ an existing doctor blade method, a coater method, and an extrusion molding method. Sheet 1 having flexibility is obtained by drying only the solvent contained in the coated slurry. Similarly to this, a mixture slurry containing an inorganic filler, thermosetting resin being solid at a room temperature, thermosetting resin being liquid at a room temperature, and solvent is prepared. Then, similarly to above, sheet 1 is formed by coating the slurry on releasing film 2, and sheet 1 having flexibility is obtained by drying the solvent.

The thermosetting resin may employ, for example, epoxy resin, phenol resin, or cyanate resin. The inorganic filler may employ $Al_2O_3$, MgO, BN, or AlN. The solvent may employ ethyl carbitol, butyl carbitol, or butyl carbitol acetate.

The thermosetting resin being liquid at room temperature may employ epoxy resin, such as bisphenol A type epoxy resin and bisphenol F type epoxy resin, or liquid phenol resin.

The solvent may employ methyl ethyl ketone, isopropanol, or toluene. If necessary, a coupling agent, dispersing agent, coloring agent, and releasing agent may be further added to a composite of sheet 1.

As described above, the solvent and thermosetting resin being liquid at room temperature are added, and the solvent is dried. This provides sheet 1 having appropriate viscosity ($10^2$ to $10^5$ Pa·s) half-hardened or partially hardened. If the viscosity is lower than $10^2$ Pa·s, sheet 1 has too much adhesion to be remove easily from releasing film 2, and thus provides poor workability due to excessive deformation after processing. If the viscosity is higher than $10^5$ Pa·s, sheet 1 has little flexibility, and thus is hardly processed at a room temperature. The viscosity ranges preferably from $10^3$ to $10^4$ Pa·s from the viewpoints of the workability and processability.

A heat-conductive board obtained by hardening sheet 1, since being filled with a large quantity of inorganic filler, has its thermal expansion coefficient is nearly equivalent to that of a lead frame made of copper, and further, has an excellent heat dissipation.

Figure 2:
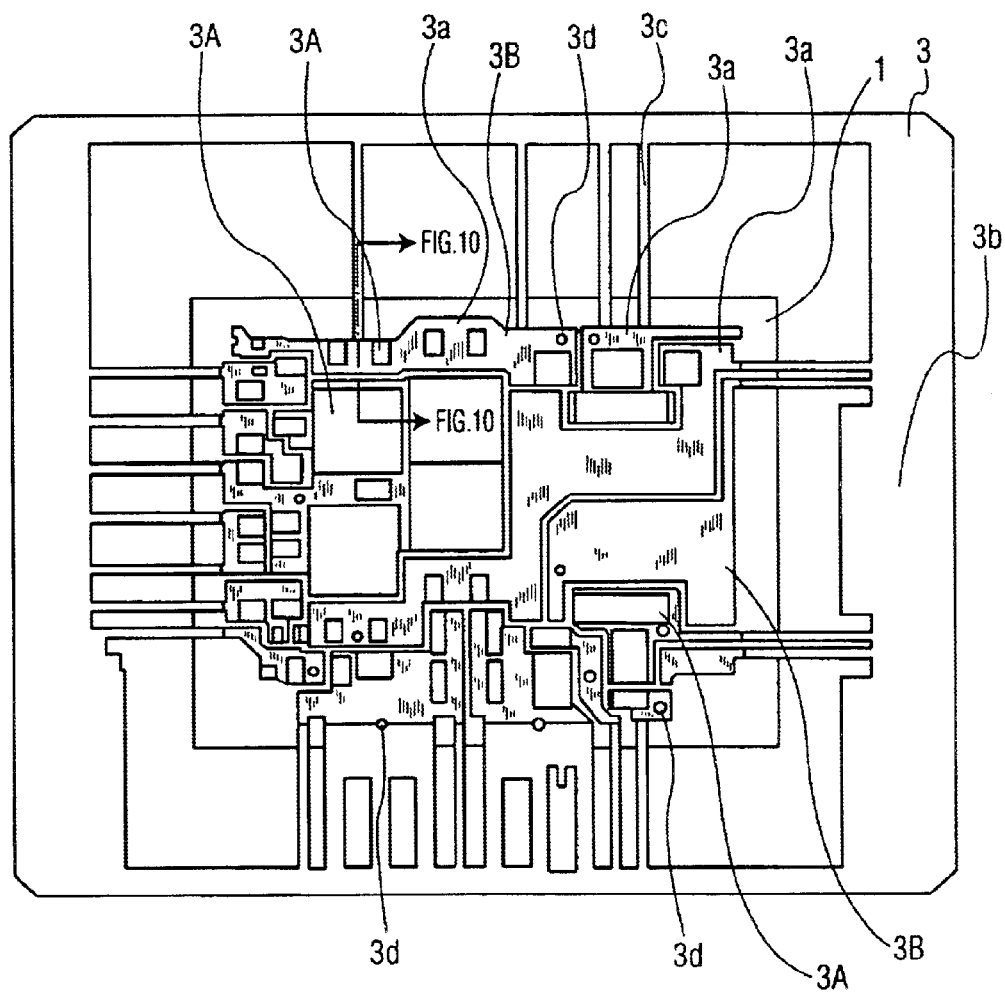
FIG. 2 is a plan view of a circuit board manufactured with the sheet according to the embodiment.

Processes of manufacturing a circuit board with sheet 1 will be described with reference to FIG. 2 to FIG. 4. In FIG. 2, lead frame 3 with a circuit formed thereon is placed on one surface of sheet 1 manufactured as described above. Then, lead frame 3 and sheet 1 are integrated by pressure molding at a temperature of 50 to 120° C. which is lower than a thermosetting temperature of sheet 1.

Lead frame 3 may be obtained by punching a copper plate to form a desired shape with a die or by etching.

In lead frame 3, plural circuit patterns 3a located like islands are formed at a center of the frame on which circuit components are mounted, outer frame portion 3 is formed at a periphery of the frame, and terminal portion 3c is formed between the center and the periphery. Circuit pattern 3a has plural holes 3d corresponding to plural positioning pins 4a of a first die 4 in FIG. 3.

Land 3A and terminal portion 3c of circuit pattern 3a on the surface (surface shown in FIG. 2) of lead frame 3, the outer frame portion 3b, and the entire back surface are nickel-plated or solder-plated to be prevented from oxidation of copper.

A surface for integrating lead frame 3 and sheet 1 has an enhanced surface roughness by sand blasting or the like for increasing the adhesion. This enables sheet 1 to have an improved physical adsorption in melting due to heat.

Figure 3:
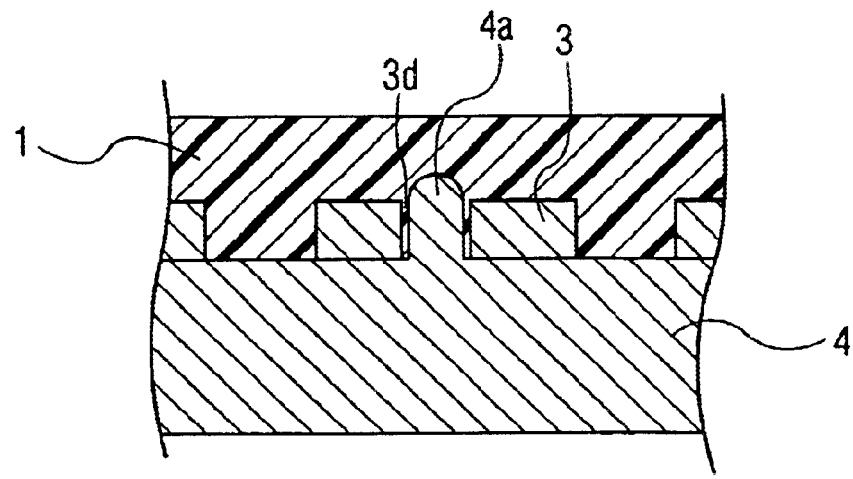
FIG. 3 is a sectional view of an essential portion of the circuit board according to the embodiment.

In FIG. 3, thermosetting resin in sheet 1, which is molded under pressure and heat at a temperature of 120 to 200° C., is cured after lead frame 3 and sheet 1 are placed on each other and are molded under pressure at a temperature ranging from 50 to 120° C. Sheet 1 is bonded after positioning pin 4a is inserted into hole 3d. Due to the pressure and heat, sheet 1 and lead frame 3 are integrated, and simultaneously, the resin, a component of the sheet 1, flows to be integrated between circuit patterns 3a of lead frame 3.

Figure 4:
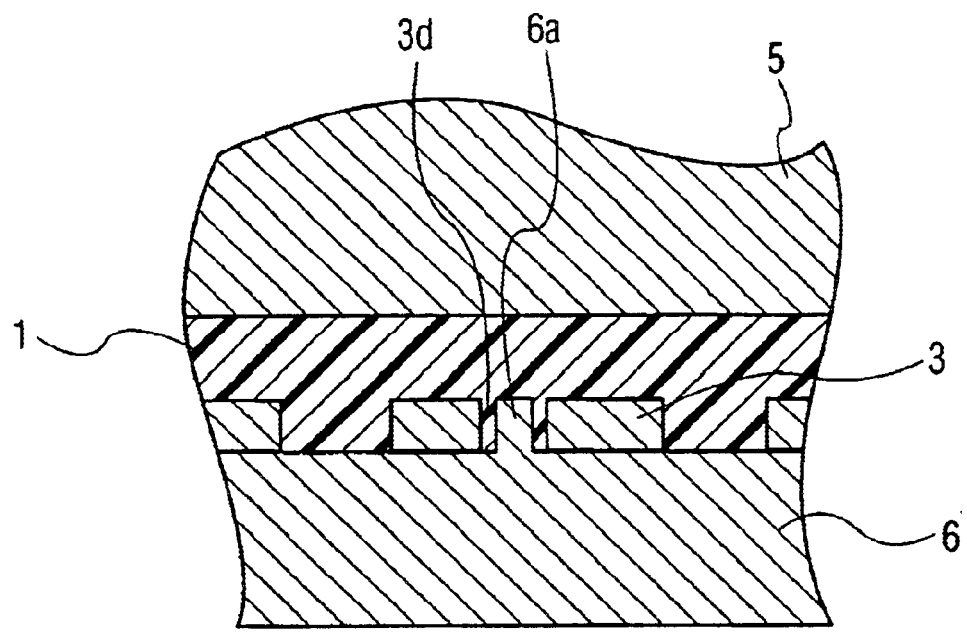
FIG. 4 is a sectional view of an essential portion of the circuit board according to the embodiment.

In FIG. 4, heat sink plate 5, which is generally a conductor, contacts with the other surface of sheet 1 after the lead frame 3 and sheet 1 placed on each other are molded under pressure at a temperature ranging from 50 to 120° C. The thermosetting resin in sheet 1 is cured, and heat sink plate 5 is integrated as well when being molded under pressure and heat at a temperature of 120 to 200° C. Then, positioning pin 6a of second die 6 is inserted into hole 3d having a smaller diameter than positioning pin 4a. The reason for this is that positioning pin 6a is inserted into hole 3d of sheet 1 integrated, and that circuit pattern 3a of lead frame 3 is not deflected since sheet 1 is integrated.

Figure 5:
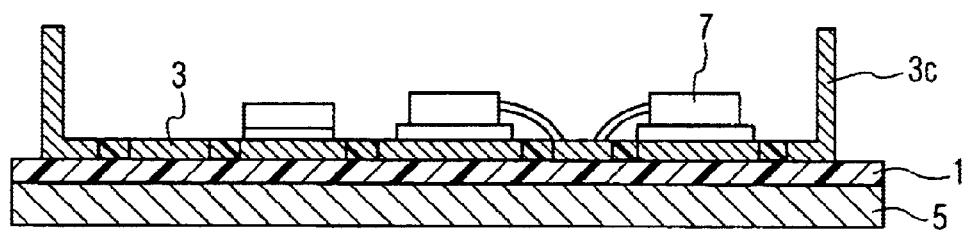
FIG. 5 is a front view of a circuit board manufactured with the sheet shown in FIG. 2.

FIG. 5 shows lead frame 3 having an unnecessary portion to be removed after electronic component 7 is mounted on the frame by soldering. Terminal portion 3c of lead frame 3 is bent perpendicularly and led out as an electrode, thereby providing an electronic device. Then, the electronic device is put into a case is filled with insulating resin, but the description is omitted.

Figure 6:
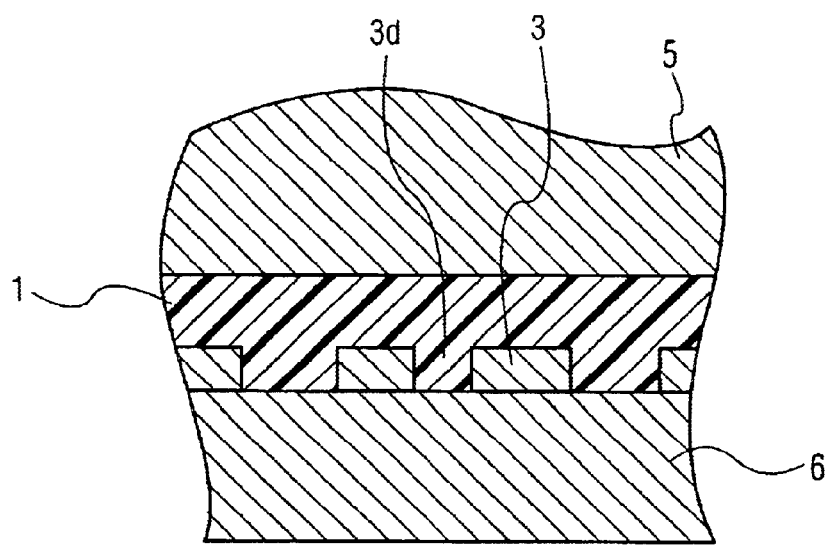
FIG. 6 is a sectional view of an essential portion of another circuit board according to the embodiment.

As shown in FIG. 6, when heat sink plate 5 is integrated, second die 6 may not have positioning pin 6a of FIG. 4, which is inserted into hole 3d of lead frame 3.

Heat sink plate 5 may include another sheet preliminarily attached on the plate before lead frame 3 having sheet 1 is attached to heat sink plate 5. When heat sink plate 5 is fixed to sheet 1, another sheet contacts with sheet 1, and temperatures of the sheets are set to be equal to or higher than respective curing temperatures of the sheets.

Thin sheet 1 allows lead frame 3 with sheet 1 to be punched easily. Even if sheet 1 is thin, another sheet, which has composition identical to that of sheet 1, attached to heat sink plate 5 assures a desired withstand voltage between heat sink plate 5 and lead frame 3.

Lead frame 3 will be further described. At the outer periphery of land 3A of circuit pattern 3a of lead frame 3 made of copper shown in FIG. 2, resist film 3B directly contacts on the copper plate. At the surface of land 3A, a plated layer directly contacts on the copper plate. Since the plated layer does not exist underneath resist film 3B, a plated layer over land 3A does not move outward of land 3A even if the plated layer melts. As shown in FIG. 5, this prevents electronic component 7 from defective mounting on land 3A. Resist film 3B may be formed by applying thermosetting ink.

That is, in a circuit board having a solder-plated layer at land 3A and electronic component 7 mounted thereon, the plated layer exists on land 3A without flowing, and this contributes to preventing the component from defective mounting.

Figure 10:
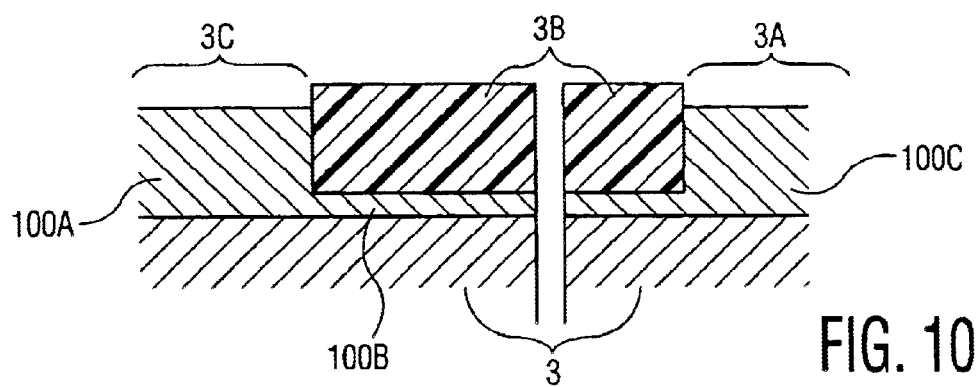
FIG. 10 is a cross-section view of the circuit board taken at line 10—10 of FIG. 2.

As described in above, land 3A and terminal portion 3c of circuit pattern 3a of lead frame 3, the outer frame portion 3b, and the entire back surface are nickel-plated or solder-plated. The plated layer 100C on the land and a plated layer 100A on the terminal portion are thicker than a plated layer 100B on a portion of the lead frame other than the land and the terminal portion, as shown in FIG. 10.

Other portion than the land and the terminal portion has a thinner plated Layer 100B. This prevents the resist film around the land from floating from lead frame 3 and deforming when the plated layer is melted and then re-fixed.

Lead frame 3 is formed by punching a copper plate, as described above, in a direction opposite to the heat sink plate shown in FIG. 5. Even if the burrs are produced on lead frame 3 due to the punching, the burrs is prevented from penetrating sheet 1 and from short-circuiting to heat sink plate 5, a conductor.

For lead frame 3, circuit pattern 3a may be formed by fixing adhesive film on one surface of a copper plate (not shown) and punching the copper plate together with the adhesive film.

Figure 7:
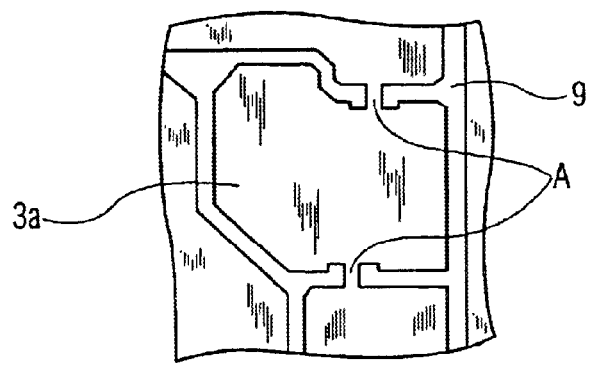
FIG. 7 is a plan view of an essential portion of a lead frame according to the embodiment.
Figure 8:
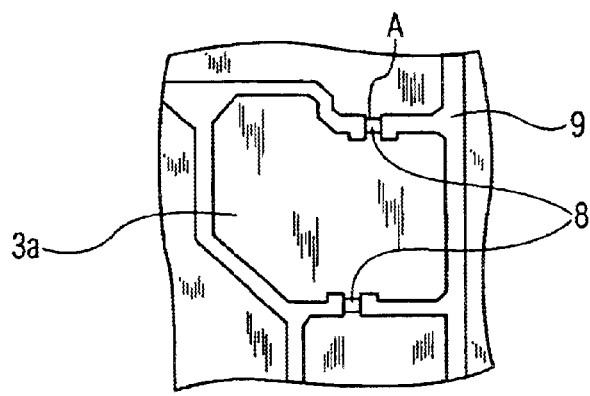
FIG. 8 is a plan view of a lead frame according to the embodiment.
Figure 9:
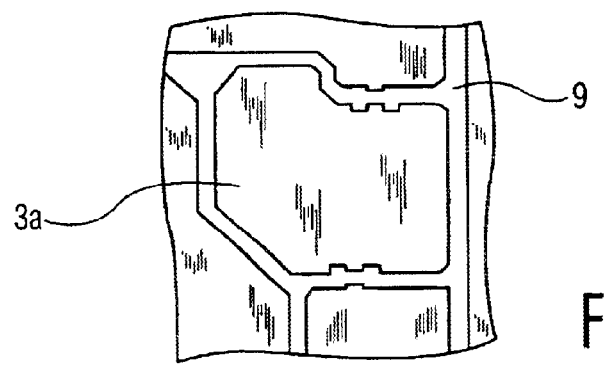
FIG. 9 is a plan view of a lead frame according to the embodiment.

Sheet 1 is bonded to a surface of lead frame opposite to the adhesive film, which lead frame has punched out groove 9 as shown in FIG. 7. Then, circuit pattern 3a like a floating island is formed, as shown in FIG. 9, by punching out coupling portion A from sheet 1 to the adhesive film with tool 8 as shown in FIG. 8.

INDUSTRIAL APPLICABILITY

According to the present invention, a circuit board includes a lead frame punched in a direction opposite to a heat sink plate. Even if burrs are produced on the lead frame due to the punching, the burrs do not penetrate a sheet or short-circuit to the heat sink plate.

Further, according to the present invention, a resist film contacts with the outer periphery of a land of a circuit pattern, and a plated layer contacts on the land. Since the plated layer does not exist underneath the resist film, a plated layer on the land does not move out of the land even when the plated layer melts. This provides a circuit board on which electronic components are not mounted on the land defectively.

What is claimed is:

1. A circuit board, comprising:

a flexible sheet;

a lead frame bonded to a first surface of said sheet, said lead frame having a circuit pattern; and a heat sink plate bonded to a second surface of said sheet, wherein said lead frame includes burrs which extend away from said sheet.

2. The circuit board according to claim 1, wherein said circuit pattern includes a land, said circuit board further comprising:

a resist film on a portion of said circuit pattern around said land; and a first plated layer on said land.

3. The circuit board of claim 2, wherein said circuit pattern further includes a terminal portion, said circuit board further comprising:

a second plated layer on said terminal portion; and a third plating layer on a portion of said lead frame other than said land and said terminal portion, said first plated layer and said second plated layer are thicker than third plated layer.

4. The circuit board of claim 1, wherein said circuit pattern of said lead frame is formed by punching, and burrs are formed at the punching.

* * * * *